United States Patent
Gao

(10) Patent No.: US 11,980,007 B2
(45) Date of Patent: May 7, 2024

(54) COOLING DISTRIBUTION UNIT FOR ELECTRONIC RACKS

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 205 days.

(21) Appl. No.: 17/557,494

(22) Filed: Dec. 21, 2021

(65) Prior Publication Data

US 2023/0200007 A1     Jun. 22, 2023

(51) Int. Cl.
H05K 7/20     (2006.01)

(52) U.S. Cl.
CPC ..... H05K 7/20272 (2013.01); H05K 7/20781 (2013.01)

(58) Field of Classification Search
CPC .............. H05K 7/20272; H05K 7/20781
See application file for complete search history.

(56) References Cited

U.S. PATENT DOCUMENTS

| | | | | |
|---|---|---|---|---|
| 10,349,560 | B2* | 7/2019 | Norton | H05K 7/20172 |
| 10,701,838 | B1* | 6/2020 | Conroy | H05K 7/20781 |
| 2008/0012333 | A1* | 1/2008 | Gauss | F16L 21/00 |
| | | | | 285/399 |
| 2010/0002393 | A1* | 1/2010 | Campbell | H05K 7/20772 |
| | | | | 361/699 |
| 2013/0128455 | A1* | 5/2013 | Koblenz | H05K 7/20836 |
| | | | | 165/294 |
| 2016/0066480 | A1* | 3/2016 | Eckberg | F16L 37/34 |
| | | | | 361/679.53 |
| 2016/0270259 | A1* | 9/2016 | Chainer | G01M 3/3227 |
| 2017/0127575 | A1* | 5/2017 | Lunsman | H05K 7/20263 |
| 2022/0412496 | A1* | 12/2022 | Nick | H05K 7/20272 |

FOREIGN PATENT DOCUMENTS

CN     105793797 A  *  7/2016  ......... H05K 7/20272

OTHER PUBLICATIONS

Franz; John, "Manifolds having slidable dripless connectors", Jul. 20, 2016, Hewlett Packard Development Co. LP., Entire Document (Translation of CN 105793797). (Year: 2016).*

* cited by examiner

*Primary Examiner* — Stephen S Sul
(74) *Attorney, Agent, or Firm* — WOMBLE BOND DICKINSON (US) LLP

(57) ABSTRACT

A connector assembly may include a distribution frame having an adjusting channel; and one or more distribution modules disposed and slidably moveable along the adjusting channel. Each of the one or more distribution modules may include an inlet connector to receive cooling liquid from a cooling liquid loop, a fluid blind mate connector to-connect the cooling liquid loop to one or more cold plates of a server chassis, and a guiding element having a guiding structure and configured to house the fluid blind mate connector. When the guiding element contacts with the server chassis, the guiding element causes the corresponding distribution module to move slightly to align the fluid blind mate connector with a server connector of the server chassis, such that the fluid blind mate connector connects with the server connector to distribute the cooling liquid to the server chassis.

20 Claims, 8 Drawing Sheets

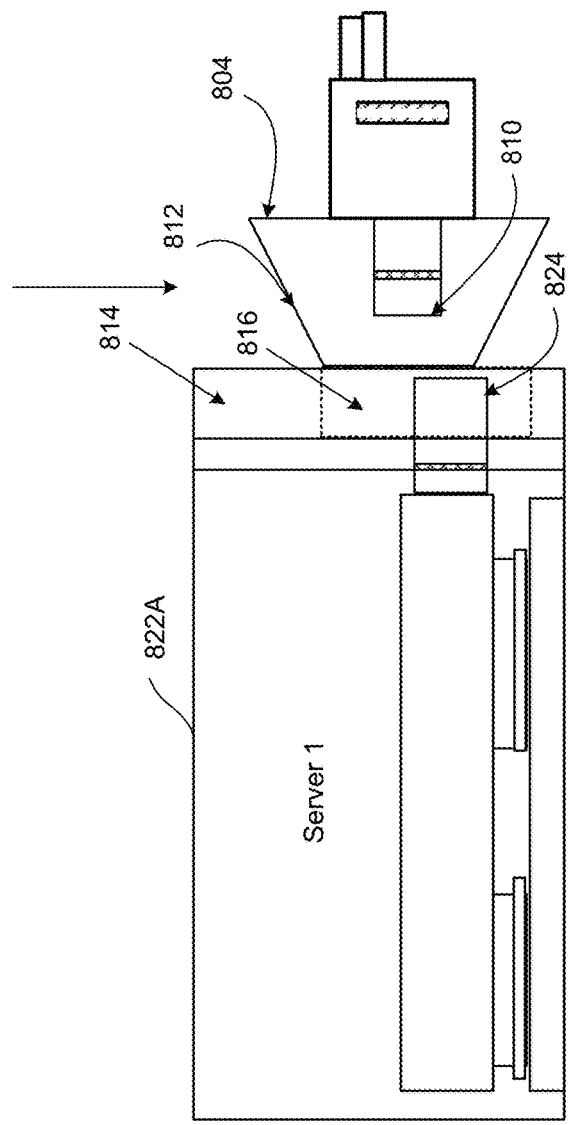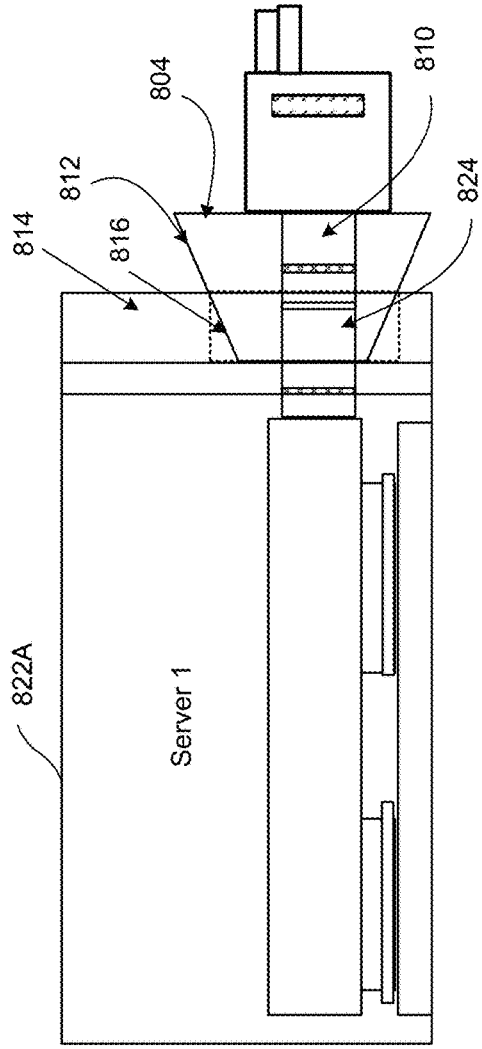
FIG. 8A
FIG. 8B

COOLING DISTRIBUTION UNIT FOR ELECTRONIC RACKS

FIELD

Embodiments of the present disclosure relate generally to electronics cooling for servers in a server rack. In particular, the connector assembly can have cooling distribution units or modules with a guiding element that helps to mate a blind mate fluid connector to a server connector while being expandable and flexible to accommodate a varying number of server chassis in a server rack.

BACKGROUND

Information Technology (IT) includes technology such as computers that are accessible through the internet or a local network, which provide storage of, or access to, data, websites, computer programs, algorithms, services, and more. IT equipment such as servers and other electronic components (e.g., peripheral devices) can be installed in a server chassis. These server chassis can then be installed in a server rack, which may also be referred to as an IT rack.

A server rack can be populated with a plurality of server chassis, each server chassis housing one or more printed circuit boards where the electronics components and integrated circuits are packaged. The server chassis can serve to manage power, thermal requirements, electronic connectivity, structural support, and other considerations of the IT equipment.

Liquid cooling for high power density electronics has increased in popularity because air cooling can be thermally insufficient in some circumstances. Liquid cooling allows for higher packaging density and increased computing load of electronics, by properly transferring the heat load generated by the electronics and at the same time, providing proper thermal environment.

A server rack may include a plurality of server chassis installed upon it. Some server chassis may have high-density components—multiple servers may be populated to and coexist in a single server chassis. Other server racks may have a single server. As such, the number and/or position of connectors from one server chassis to another in a server rack may vary based on the type or number of servers that are housed by the server chassis.

A server rack may include infrastructure (e.g., rack cooling component) to distribute and manage fluid (e.g., a liquid coolant) to and from each of the server chassis that are populated within the server rack. This infrastructure may form a fluid recirculation loop for the server chassis and the server rack. However, conventional infrastructure lacks flexibility to accommodate various configurations of the server chassis and the server rack.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

FIGS. 8A and 8B show an example of a connector assembly operation before alignment and after alignment with a server chassis, according to some embodiments.

DETAILED DESCRIPTION

Figure 1:
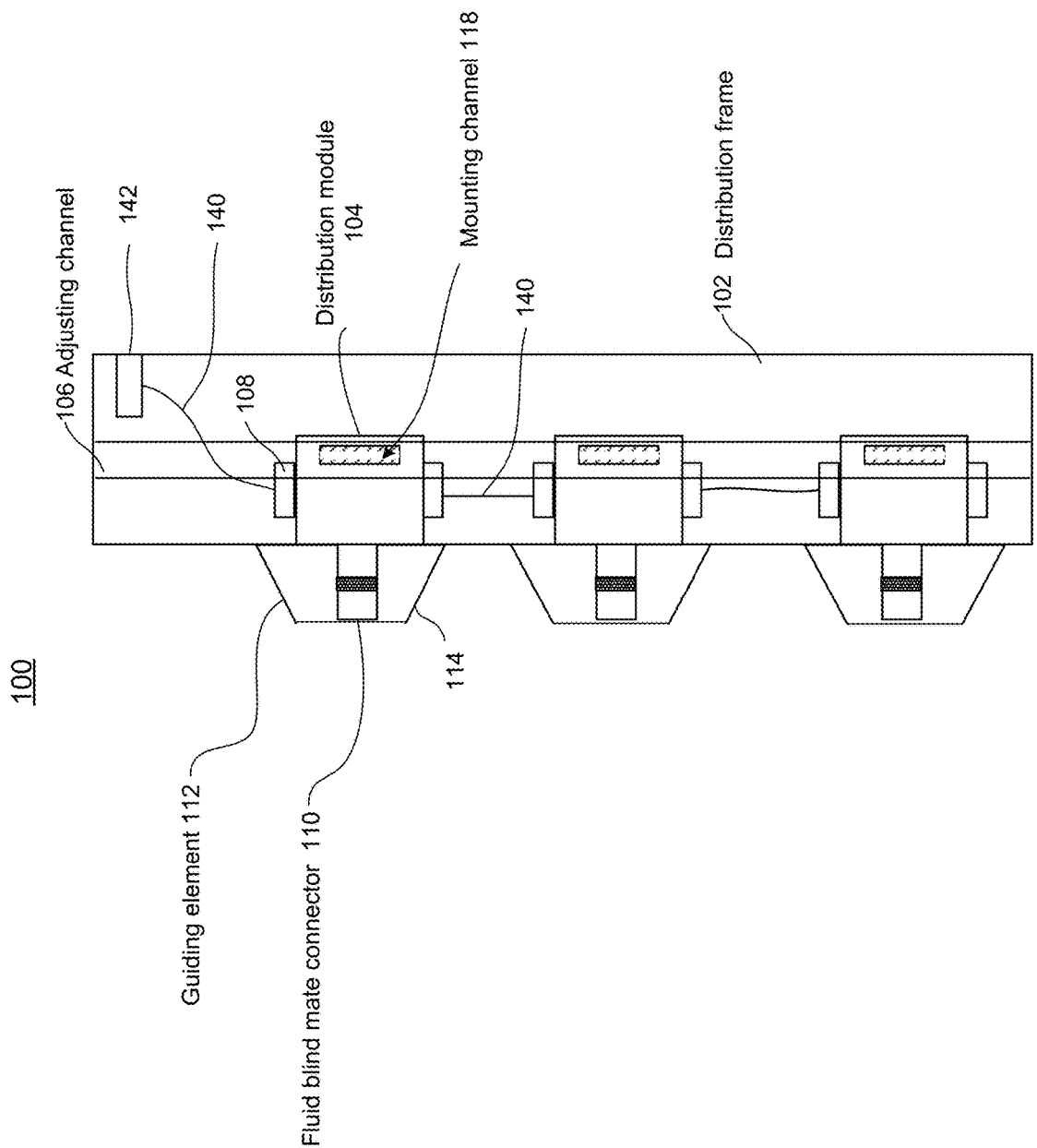
FIG. 1 shows a side view of a connector assembly, according to some embodiments.

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

The existing solution using a rack manifold for fluid distribution with the rack manifold including fluid connectors fixed on a main frame. This solution however may not accommodate different use cases and may not be expandable and flexible for different deployment scenarios. Embodiments of the present disclosure provides an advanced rack cooling solution for different deployment scenarios including different racks and server designs. The solution may also enable more efficient rack level fluid distribution design for liquid cooling solutions.

Embodiments of the present disclosure can address issues identified, such as accommodating various configurations of a server chassis and electronics rack in a flexible and modular manner; providing highly reliable design; providing an efficient leak detection implementation; a high scalability solution; providing different redundant design; enabling a cost effective design for blind mating connectors; an efficient installation, removal, and serviceability of each server chassis in the server rack; and/or accommodating different liquid cooling solutions.

According to one aspect, a connector assembly may include a distribution frame including an adjusting channel;

and one or more distribution modules disposed and slidably moveable along the adjusting channel. Each of the one or more distribution modules may include an inlet connector to receive cooling liquid from a cooling liquid loop, a fluid blind mate connector to connect the cooling liquid loop to one or more cold plates of a server chassis, and a guiding element having a guiding structure and configured to house the fluid blind mate connector. When the guiding element contacts with the server chassis, the guiding element causes the distribution module to move slightly to align the fluid blind mate connector with a server connector of the corresponding server chassis, such that the fluid blind mate connector connects with the server connector of the server chassis.

In one embodiment, the connector assembly may also include a guiding panel that can be disposed and coupled to a rear portion of the server chassis. The guiding panel may have one or more openings configured to guide the guiding element during a coupling of the fluid blind mate connectors on the server chassis and the rack manifolds, to form a fluid connection between the server chassis and the cooling liquid loop, which may be connected to an external cooling source.

In one embodiment, the connector assembly may further include a flexible hose connecting the one or more distribution modules to a cooling liquid loop connector, thereby forming a fluid connection between the cooling liquid loop connector and the one or more distribution modules.

In one embodiment, the connector assembly may additionally include one or more connectors disposed on predefined locations on each of the one or more distribution modules. Each of the one or more distribution modules may include a plurality of fluid channels for delivery of cooling fluid via one of the one or more connectors to the server chassis through the fluid blind mate connector.

In one embodiment, the plurality of fluid channels may be configured to distribute the cooling fluid from one of the one or more connectors to another one of the one or more connectors, thereby ensuring continuity of fluid distribution within a network of the one or more distribution modules.

In one embodiment, the one or more connectors are disposed on a rear portion of the one or more distribution modules, the one or more connectors being configured to connect the one or more distribution modules to a first supply connector of the cooling liquid loop via a first flexible hose to form a first fluid supply and return lines between the cooling liquid loop and the server chassis.

In one embodiment, at least one of the one or more connectors is configured to connect the distribution module to another distribution module via the first flexible hose.

In one embodiment, at least one of the one or more connectors is configured to connect the distribution module to a second supply connector via a second flexible hose, to form a second fluid supply and return lines between the cooling liquid loop and the server chassis.

In one embodiment, the connector assembly may also include a leak detection arrangement including a first leak detector disposed underneath a rear portion of the one or more distribution modules.

In one embodiment, the connector assembly may further include a leak detection arrangement including a second leak detector disposed underneath the server connectors of the server chassis.

According to another aspect, an electronic rack may include multiple server chassis and a connector assembly, attached to each of the server chassis. The connector assembly may include a distribution frame including an adjusting channel; and distribution modules corresponding to the plurality of server chassis and disposed and slidably moveable along the adjusting channel. Each of the one or more distribution modules may include an inlet connector to receive cooling liquid from a cooling liquid loop, a fluid blind mate connector to connect the cooling liquid loop to one or more cold plates of the corresponding server chassis, and a guiding element having a guiding structure and configured to house the fluid blind mate connector. When the guiding element contacts with the server chassis, the guiding element causes the corresponding distribution module to move slightly to align the fluid blind mate connector with a server connector of the corresponding server chassis, such that the fluid blind mate connector connects with the server connector of the server chassis to distribute the cooling liquid to the server chassis.

According to a further aspect, a data center may include electronic racks, each of the electronic racks may include multiple server chassis and a connector assembly, attached to each of the server chassis. The connector assembly may include a distribution frame including an adjusting channel; and distribution modules corresponding to the plurality of server chassis and disposed and slidably moveable along the adjusting channel. Each of the distribution modules may include an inlet connector to receive cooling liquid from a cooling liquid loop, a fluid blind mate connector to distribute the cooling liquid to one or more cold plates of a corresponding server chassis, and a guiding element having a guiding structure and configured to house the fluid blind mate connector. When the guiding element contacts with the server chassis, the guiding element causes the corresponding distribution module to move slightly to align the fluid blind mate connector with a server connector of the server chassis, such that the fluid blind mate connector connects with the server connector.

FIG. 1 shows a side view of an example of a connector assembly, according to some embodiments. A connector assembly 100 is shown that is to attach to a server chassis to populate a server rack.

Referring to FIG. 1, the connector assembly 100 may include a distribution frame 102 including an adjusting channel 106. The connector assembly 100 may also include one or more distribution modules 104 disposed and slidably moveable along the adjusting channel 106. Each of the one or more distribution modules 104 may include an inlet connector 108 to receive cooling liquid from a cooling liquid loop, a fluid blind mate connector 110 to connect the cooling liquid loop to one or more cold plates of a server chassis (not shown), and a guiding element 112 having a guiding structure 114 and configured to house the fluid blind mate connector 110. When the guiding element 112 contacts with the server chassis, the guiding element 112 causes the distribution module 104 to move slightly (e.g., up and down) to align the fluid blind mate connector 110 with a server connector of the server chassis, such that the fluid blind mate connector 110 connects with the server connector to distribute the cooling liquid to the server chassis.

The connector assembly 100 may additionally include a flexible hose 140 connecting the one or more distribution modules 104 to a supply connector 142, to form a fluid connection between the supply connector 142 and the one or more distribution modules 104, where supply connector 142 may be coupled to an external cooling liquid loop such as a data center cooling loop. Each of the one or more distribution modules 104 may further include a connector to connect with another one of the distribution modules 104 or the connectors on the cooling liquid loop.

In this example, each distribution module includes an inlet connector such as connector 108 to receive incoming cooling liquid and an outlet connector (e.g., disposed at the bottom of the distribution module) to supply cooling liquid to another distribution module. As shown in FIG. 1, in this example, all of the distribution modules 140 are coupled in a chain using flexible hoses via their respective inlet and outlet connectors, in addition to the blind mate connector 110. As a result, each distribution module can distribute cooling liquid to its associated server chassis, as well as a downstream distribution module coupled via flexible hose 140.

The flexible hose 140 may connect the one or more distribution modules 104 to a cooling liquid loop connector 142 to form a fluid connection between the cooling liquid loop connector and the one or more distribution modules 104. The flexible hose 104 can be either integrated with the distribution module 104 or can be provided as a separate part. In one embodiment, the connector assembly 100 may be preassembled based on a design specification and then can be integrated to a server rack.

In one embodiment, the connector assembly 100 may further include a mounting channel 118 configured to mount the one or more distribution modules 104 on the adjusting channel 106. The mounting channel 118 may enable the one or more distribution modules 104 to be fixed at a predetermined location. Alternatively, the mounting channel 118 may also enable the one or more distribution modules 104 to move up and down along the adjusting channel 106. That means the location of the fluid blind mate connector 110 can be adjusted, for example, for the purpose of aligning with a server connector of a server chassis. In this manner, the location of the fluid blind mate connector 110 can be adjusted according to a corresponding server location.

The guiding element 112 is the main trigger for adjusting the location of the fluid blind mate connector 110 and the guiding element 112, connector 108 as well as the one or more distribution modules 104. The guiding element 112, the fluid blind mate connector 110, and the one or more distribution modules 104 are fixed together. The movement of the guiding element 112 during the engagement causes the one or more distribution modules 104 and the fluid blind mate connector 110 to move to ensure the fluid blind mate connector 110 to align and engage with the server connector. The guiding element 112 may be configured to control the location of the one or more distribution modules 104 during the engagement between the fluid blind mate connector 110 and the server connector. In this manner, the guiding element 112 may provide self-aligning feature facilitate self-alignment of the fluid blind mate connector 110 and the server connector during the engagement.

Note that connector assembly 100 has been described as an example of a supply connector assembly to receive cooling liquid from an external cooling loop or external cooling source and to distribute or supply the cooling liquid to the server chassis when connected. In one embodiment, connector assembly 100 may also be utilized as an example of a return connector assembly to receive the cooling liquid from the server chassis and return the cooling liquid carrying the heat exchanged from the server chassis back to the external cooling loop or source. That is, an electronic rack having a stack of server chassis would include two connector assemblies: a supply connector assembly and a return connector assembly. FIG. 1 represents both the supply and return manifold side, and in this example, the cooling liquid loop connector 142 can be understood as either the inlet connector to be connected to the external cooling loop or the return connector to be connected to the external cooling loop.

Figure 2:
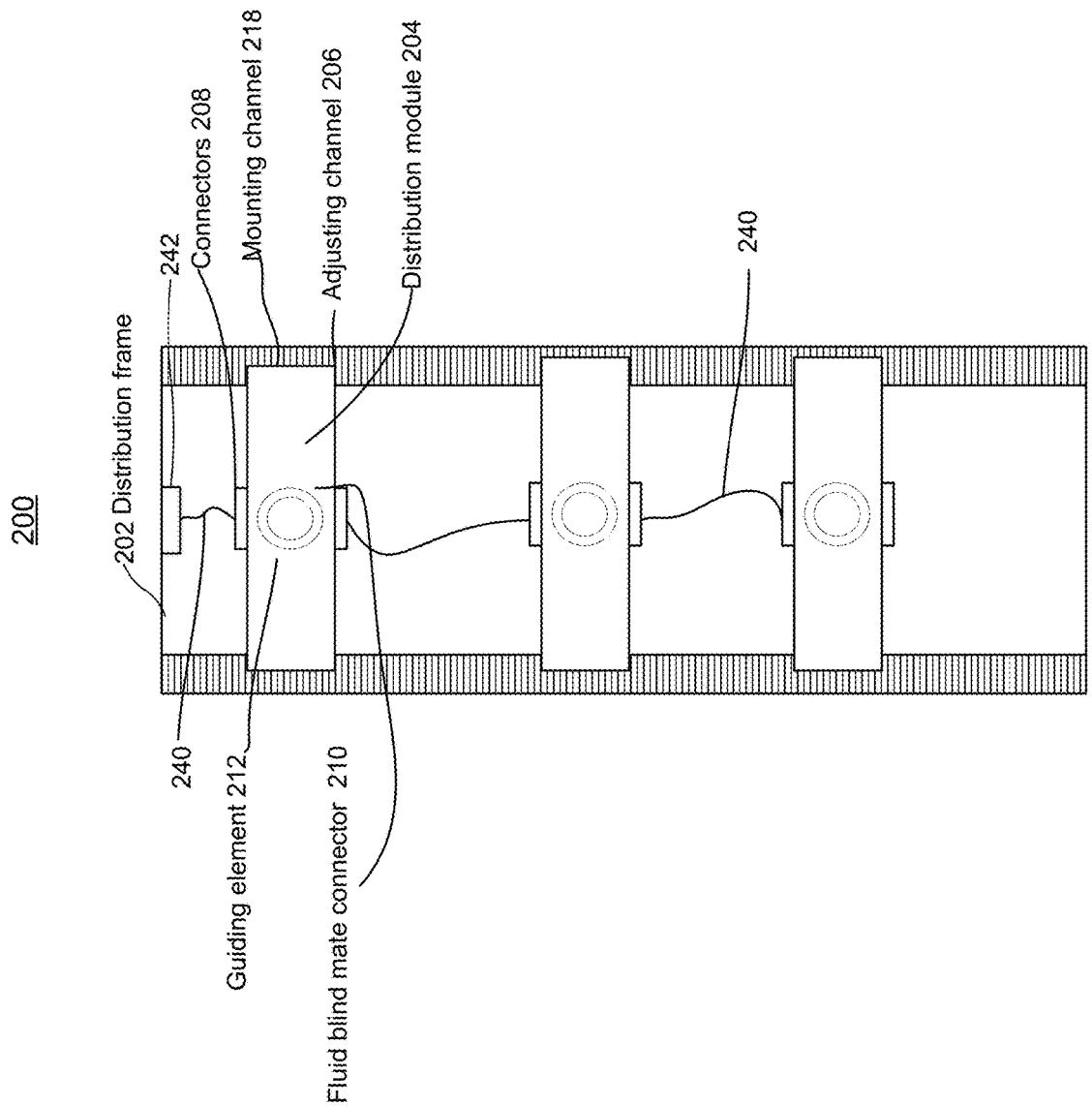
FIG. 2 shows a front view of a connector assembly, according to some embodiments.

FIG. 2 shows a front view of an example of a connector assembly 200, according to some embodiments. Referring to FIG. 2, the connector assembly may represent the connector assembly 100 in FIG. 1. As described above, the connector assembly 200 may include a distribution frame 202 including an adjusting channel 206. The connector assembly 200 may also include one or more distribution modules 204 disposed and slidably moveable along the adjusting channel 206. Each of the one or more distribution modules 204 may include an inlet connector 208 to receive cooling liquid from a cooling liquid loop, a fluid blind mate connector 210 to connect the cooling liquid loop to one or more cold plates of a server chassis, and a guiding element 212 configured to house the fluid blind mate connector 210.

When the guiding element 212 contacts with the server chassis, the guiding element 212 causes the one or more distribution modules 204 to move slightly (e.g., up and down) to align the fluid blind mate connector 210 with a server connector, such that the fluid blind mate connector 210 connects with the server connector. The connector assembly 200 may additionally include a flexible hose 240 connecting the one or more distribution modules 204, in this example, in a chain, to a cooling liquid loop connector to form fluid connection between the cooling liquid loop connector 242 and the one or more distribution modules 204.

Cooling liquid loop connector 242 may be coupled to an external cooling loop or an external cooling source. Cooling liquid loop connector 242, also referred to as a supply connector and return connector, may be coupled to any one of the distribution modules 240 via a flexible hose. In this example, cooling loop connector 242 is coupled to an inlet connector 208 of the top distribution module in the chain via a flexible hose. In one embodiment, the cooling loop connector 242 is a part of the one or more distribution modules 204 and the cooling loop connector 242 is connected to the one or more distribution modules 204 through flexible hoses 240.

In one embodiment, a mounting channel 218 may be configured to mount the one or more distribution modules 204 on the adjusting channel 206. In one embodiment, the adjusting channel 206 may be a pair of tracks that allow the one or more distribution modules 204 to slidably move up and down the adjusting channel 206. The mounting channel 218 and the adjusting channel 206 may have sufficient friction in between while moveable up and down, such that a distribution module can be moved up and down and can stop at any location along the adjusting channel 206.

Note that connector assembly 200 has been described as a supply connector assembly to receive cooling liquid from an external cooling loop or external cooling source. However, connector assembly 200 may also be utilized as a return connector assembly to receive the cooling liquid from the server chassis carrying the heat exchanged from the server chassis and to return the cooling liquid back to the external cooling loop or source.

Figure 3:
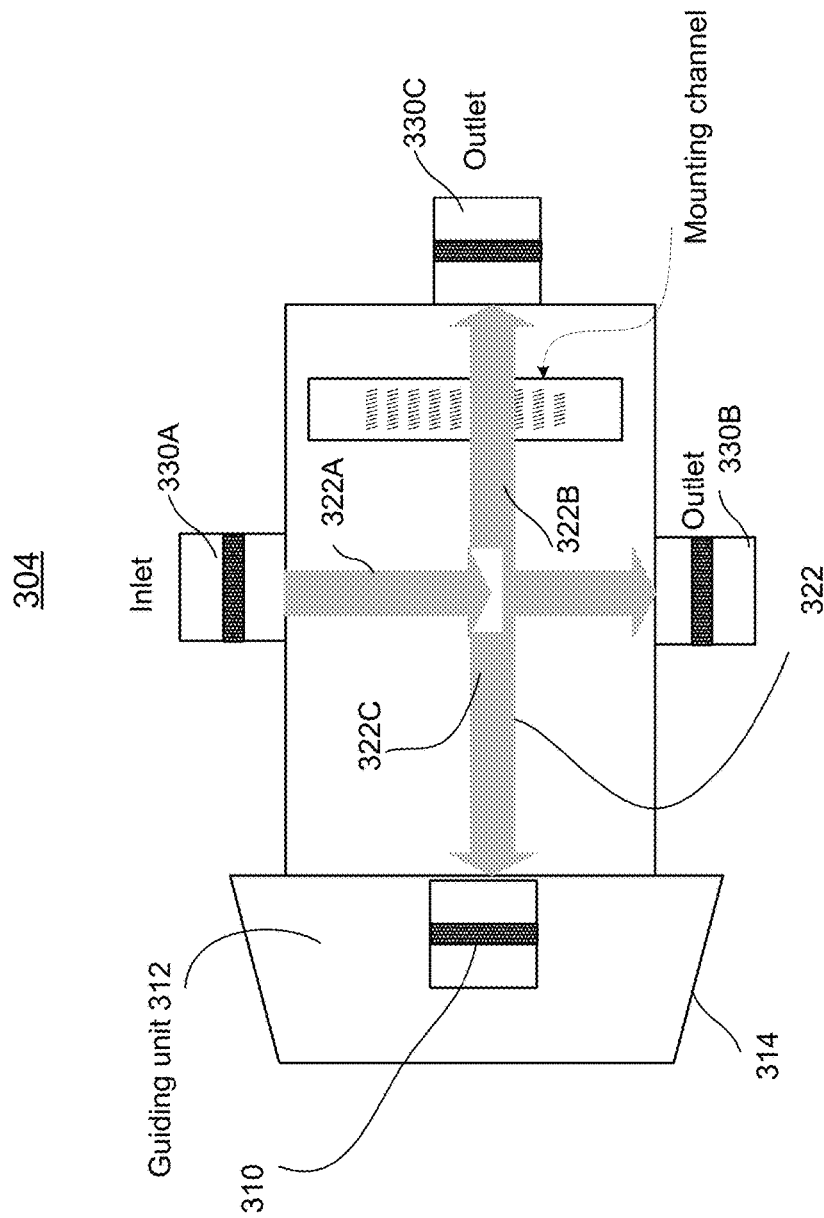
FIG. 3 shows a side view of a distribution module, according to some embodiments.

FIG. 3 shows an example of a distribution module 304, according to some embodiments. The distribution module 304 may represent the distribution module 104 in FIG. 1. Referring to FIG. 3, the distribution module 304 may further include one or more connectors 330A, 330B, 330C disposed on predefined locations on the distribution module 304. The distribution module 304 may include fluid channels 322 for delivery of cooling fluid via one of the one or more connectors 330A, 330B, 330C to the server chassis through the fluid blind mate connector 310. The fluid channels 322 may be built-in within the distribution module 304.

In one embodiment, the fluid channels 322 may be configured to distribute the cooling fluid from one of the one or more connectors to another one of the one or more connectors, thereby ensuring continuity of fluid distribution within a network of the one or more distribution modules 304. For example, fluid channel 322A may be configured to provide a fluid path for the cooling fluid from connector 330A to connector 330B. In this manner, the fluid channel 322A may enable the cooling fluid to be distributed from the distribution module 304 to another distribution module in a network of distribution module. In another example, the fluid channel 322B may be configured to provide a fluid path for the cooling fluid from connector 330A to connector 330C. In this manner, the fluid channel 322B may enable the cooling fluid to be distributed from the distribution module 304 to a supply connector (not shown). In yet another example, the fluid channel 322C may be configured to provide a fluid path for the cooling fluid from connector 330A to a blind mate fluid connector 310.

As described above, the distribution module 304 may include a guiding element 312 having a guiding structure 314 and configured to house the fluid blind mate connector 310. When the guiding element 312 contacts with the server chassis, the guiding element 312 causes the one or more distribution modules 304 to move slightly to align the fluid blind mate connector 310 with a server connector of the server chassis, such that the fluid blind mate connector 310 connects with the server connector to distribute the cooling liquid to the server chassis.

Figure 4:
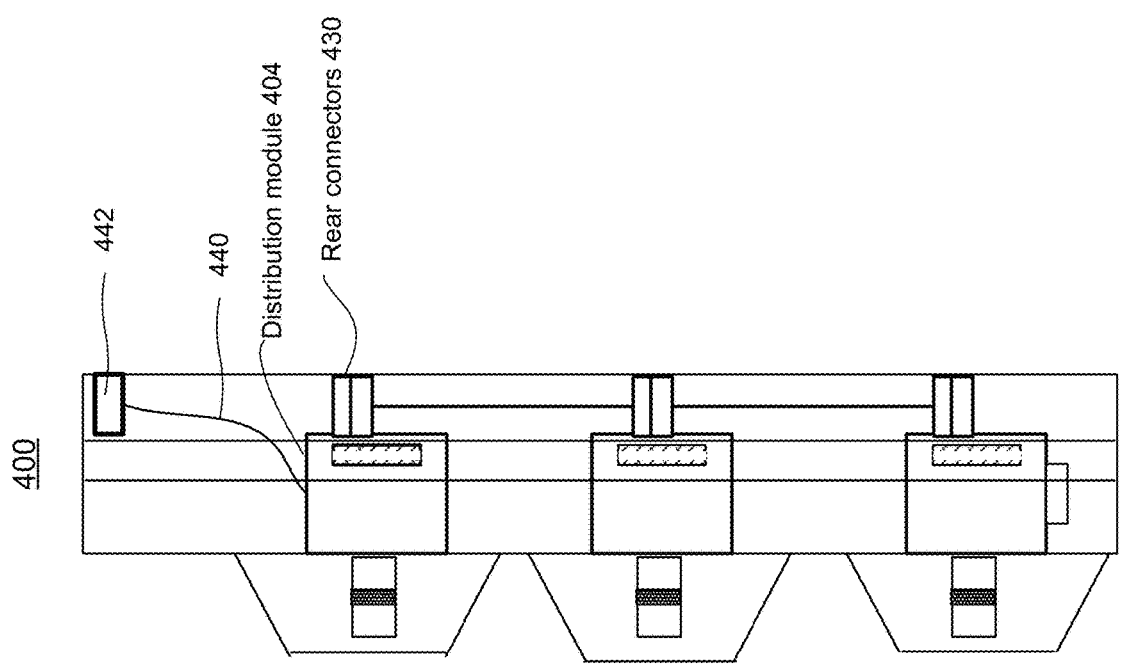
FIG. 4 shows a side view of a connector assembly with a rear connector, according to some embodiments.

FIG. 4 shows an example of a side view of a connector assembly 400, according to some embodiments. In this example, three distribution modules 404 are arranged in a network of connector assembly 400 for illustrative purposes. Although three distribution modules 404 are shown, any number of distribution models may be used in a network of connector assembly 400. Referring to FIG. 4, in one embodiment, the one or more connectors 430 may be disposed on a rear portion of the one or more distribution modules 404. The one or more connectors 430 may be configured to connect the one or more distribution modules 404 to a first supply connector or cooling liquid loop connector 442 via a first flexible hose 440 to form a first fluid supply and return lines between the external cooling liquid loop and the server chassis.

In this example, some of the distribution modules include a rear connector on the rear such as rear connector 430 to connect with another distribution module. The rear connector is configured to operate as an inlet connector to receive the cooling liquid from an upstream distribution module, to distribute at least a portion of the cooling liquid to a corresponding server chassis via a blind mate connector, and to supply at least a portion of the cooling liquid to a downstream distribution module in the chain. Similarly, if connector assembly 400 is utilized as a return connector assembly, the rear connector is configured to receive cooling liquid from the corresponding server chassis and a downstream distribution module, and return the received cooling liquid to an upstream distribution module.

Figure 5:
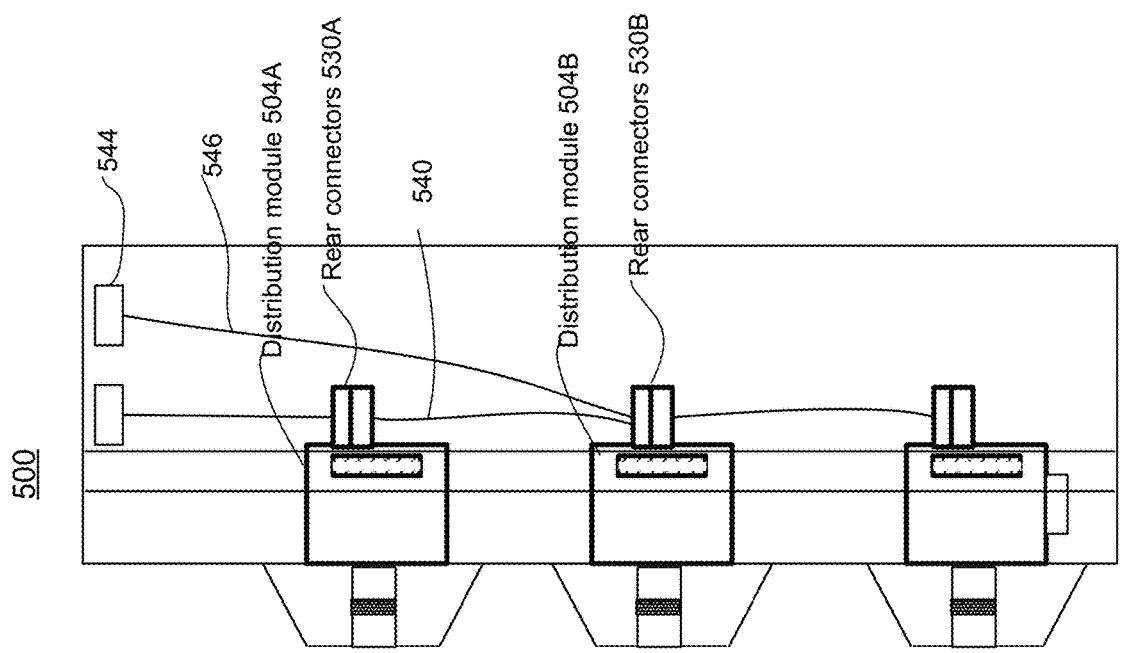
FIG. 5 shows a side view of a connector assembly configured with multiple loop, according to some embodiments.

FIG. 5 shows an example of a side view of a connector assembly 500, according to some embodiments. The connector assembly 500 may represent any of the connector assemblies described above. Referring to FIG. 5, in one embodiment, at least one of the one or more connectors 530A may be configured to connect the distribution module 504A to another distribution module 504B via a first flexible hose 540.

In one embodiment, at least one of the one or more connectors 530B may be configured to connect the distribution module 504B to a second supply connector 544 via a second flexible hose 546 to form a second fluid supply and return lines between the cooling liquid loop and the server chassis.

FIG. 5 shows a multiple loop integration that can be implemented with the connector assembly. It can be seen that separate loops can be configured in this implementation. For example, the second fluid supply and return lines can be configured between the cooling liquid loop and the server chassis by connecting the one or more connectors 530B of the one or more distribution modules 504B to the second supply connector 544 via the second flexible hose 546. This implementation shows that the connector assembly 600 is flexible to adapt to actual operating scenarios, such as to form different redundant loop requirements.

Figure 6:
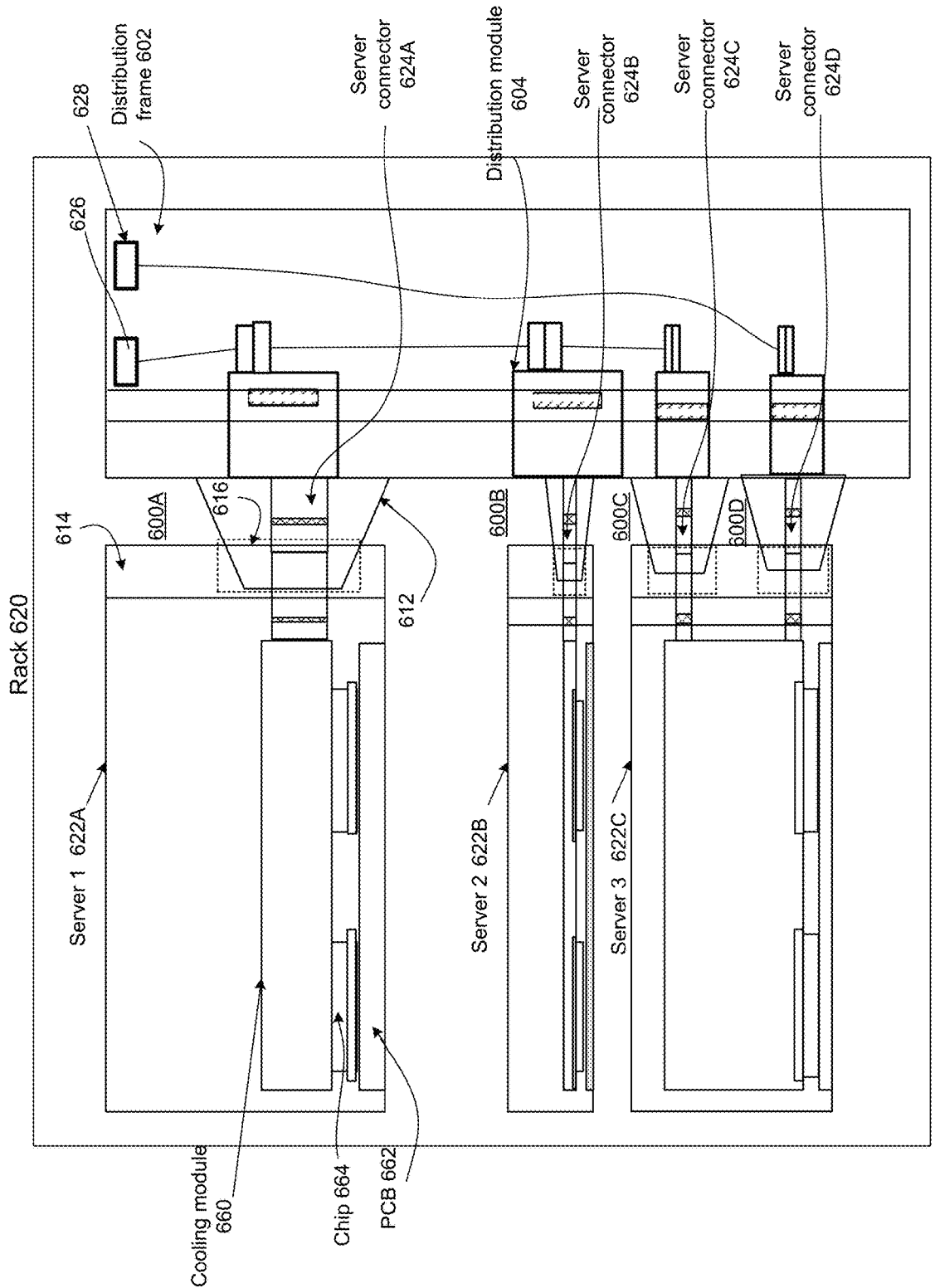
FIG. 6 shows an example of a server rack that includes a plurality of server chassis and a plurality of connector assemblies, according to some embodiments.

FIG. 6 shows an example of a server rack 620 that includes server chassis 622A, 622B, and 622C and connector assemblies 600A, 600B, 600C, and 600D according to some embodiments. The server chassis 622A, 622B, and 622C can be collectively referred to as server chassis 622. As shown, the sever chassis 622A may be assembled with a cooling module 660 and the server 624A connector maybe fixed onto the cooling module 660. The connector assembly 600A may be configured for cooling an electronic server component 660 positioned on a circuit board such as a printed circuit board (PCB) 662. The cooling module 660 is thermally coupled to one or more electronic server components 664 such as, for example, an integrated circuit (IC) which can be a surface mounted device (SMD) that is fixed to a printed circuit board (PCB) 662.

Referring to FIG. 6, the connector assembly 600A may also include a guiding panel 614 to be coupled to a rear portion of the server chassis 622A. The guiding panel 614 may have one or more openings 616 configured to guide the guiding element 612 during a coupling of the fluid blind mate connector 610 and the server connector 624A to form a fluid connection between the server chassis 622A and the cooling liquid loop.

As illustrated in FIG. 6, server chassis 1 622A may include one server connector 624A, server chassis 2 622B may include a server connector 624B with a different form factor, and server chassis 3 622C may include two server connectors 624C, 624D. It can be seen that the embodiments of the present disclosure may be implemented with different distribution systems. For example, one implementation can be configured for deploying server chassis 1 622A, server chassis 2 622B, and server chassis 3 622C, as shown in FIG. 6. In one embodiment, a new server arrangement within the server rack server 602 may be implemented, wherein server chassis 2 622B is populated above the server chassis 1 622A. The embodiments of the present disclosure can be configured to satisfy this new server arrangement without requiring a new hardware. For example, the distribution module 604 can be slidably moved to a new position so the blind mate fluid connector of the distribution module 604 can be aligned with the new position of the server connector 624B.

As shown, in one embodiment, the server chassis 3 622C may be coupled to the distribution manifold 626 (e.g., main source) via a first loop. The first loop may be configured using a distribution module 600C of server chassis 2 622B, the rear port of server chassis 2 622B, and the rear port of server chassis 1 622A. In another embodiment, a distribution module 600C of server chassis 3 600D may be coupled to a secondary source 628 via a second loop.

Figure 7:
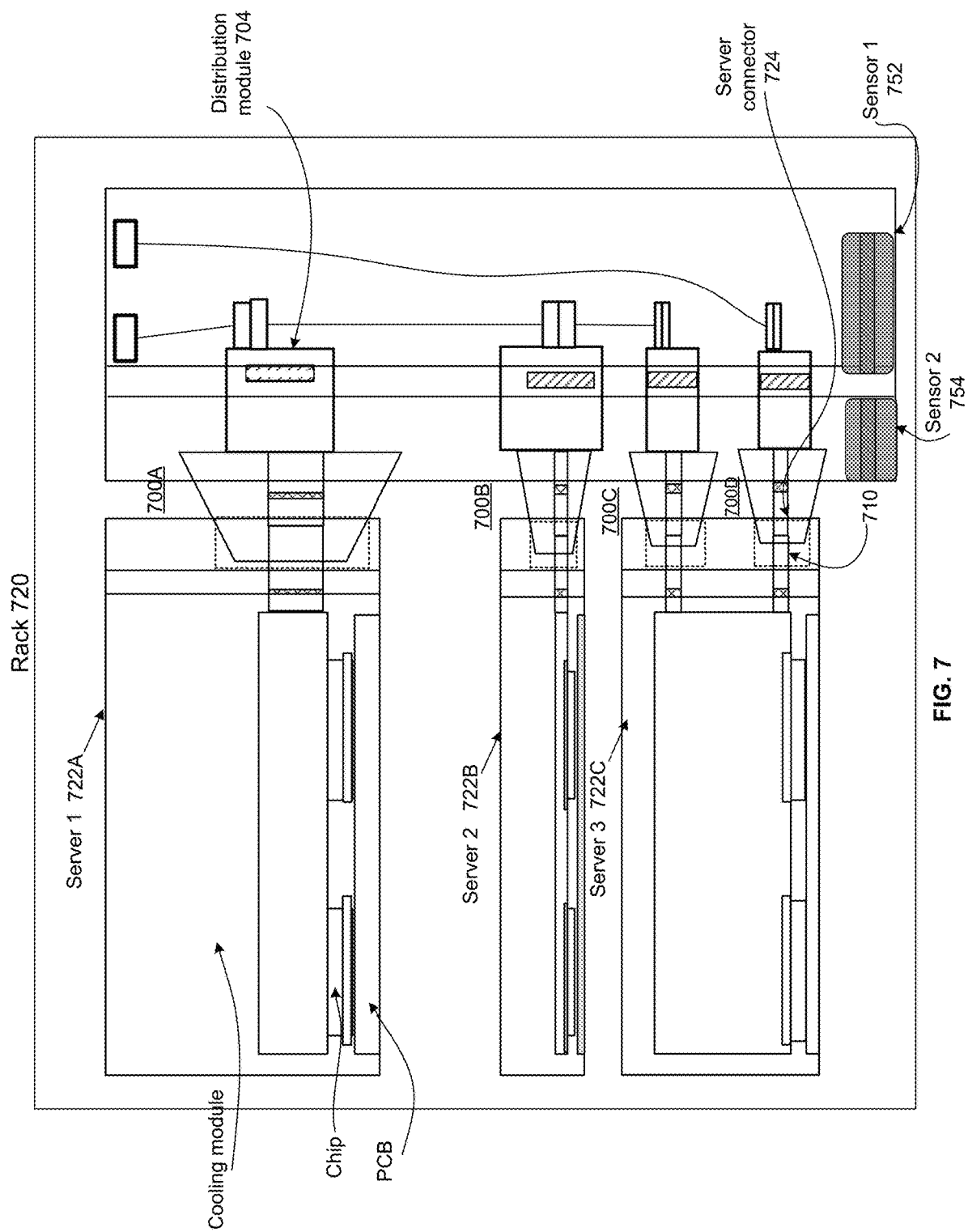
FIG. 7 shows an example of a server rack that includes a plurality of server chassis, a plurality of connector assemblies, and leak detection arrangement, according to some embodiments.

FIG. 7 shows an example of a server rack 720 that includes server chassis 722A, 722B, 722C and connector assemblies 700A, 700B, 700C, 700D according to some embodiments. The server rack 720 may represent the server rack 620 in FIG. 6.

Referring to FIG. 7, the connector assembly 700 may further include a leak detection arrangement including a first leak detector 752 (sensor or apparatus) disposed underneath a rear portion of the guiding element of the one or more distribution modules 704. The leak detection arrangement integrates the first leak detector 752 at the connection surface between the rear portion of the one or more distribution modules 704 and a rear connector disposed on a rear portion of the one or more distribution modules 704. This is the place most susceptible to developing leaks, so placing the leak detector in this position would be most advantageous. The leak detector 752 (sensor or apparatus) may be coupled to this location and configured to sense cooling fluid leakage into the location where the cooling fluid is supplied to the distribution module 704.

In one embodiment, the connector assembly 700 may further include a leak detection arrangement including a second leak detector 754 disposed underneath the server connectors such as the server connector 724 of the server chassis. For example, the leak detection arrangement integrates the second leak detector 754 (sensor or apparatus) at the connection surface between the fluid blind mate connector 710 and the server connector 724. This ensures that the second leak detector 754 identifies the leaking of the cooling fluid before the cooling fluid leaks out from the connection interface.

FIGS. 8A and 8B are an example of a distribution module before alignment and after alignment with a server chassis, according to some embodiments. Referring to FIG. 8A, the distribution module 804 is not aligned with the server chassis 822A. As shown, the guiding element 812 contacts with a rear portion of the server chassis 822A but the blind mate fluid connector is not aligned with a server connector 824 yet. The guiding structure of the guiding element 812 is not inserted in an opening 816 of the guiding panel 814. The opening 816 may be configured to guide the guiding element 812 during a coupling of the fluid blind mate connector 810 and the server connector 824. When the guiding element 812 contacts with an edge of opening 816 of the server chassis 822A, due to the shape of the guiding element (e.g., cone shape), the edge of the opening 816 forces the guiding element 812 and the distribution module 804 to move slightly (in this example, downwardly as illustrated by a pointing down arrow) to align the fluid blind mate connector 810 with the server connector 824, such that the fluid blind mate connector 810 connects with the server connector 824. In this manner, the guiding element 812 may facilitate self-alignment of the fluid blind mate connector 110 and the server connector during the engagement.

Referring to FIG. 8B, a portion of the guiding structure of the guiding element is inserted into one of the openings, such that the distribution module 804 is now aligned with the server chassis 822A. As a result, the fluid blind mate connector 810 is now aligned and connected with the server connector 824.

The present disclosure is also directed to an electronic rack, including a number of server chassis, and a connector assembly as described above, attached to each of the number of server chassis. The present disclosure is also directed to a data center including number of electronic racks. Each of the number of electronic racks may include server chassis and a connector assembly as described above, attached to each of the number of server chassis.

Furthermore, although not shown, a server rack can, in some embodiments, include various other supporting components. For example, a server rack can include a cooling distribution unit (CDU), or a rack management unit (RMU). The server chassis can also be referred to as a server blade that can be inserted into an array of server slots respectively from frontend or backend of the server rack. A server rack can be either open to the environment or partially contained by a rack container. The server rack can include one or more cooling fans that can generate airflow from a frontend to a backend of the server rack. In some embodiments, a server rack may include a cooling fan for each server chassis. The cooling fans may be mounted on each server chassis to generate airflow through the server chassis. In some embodiments, the CDU can include a heat exchanger, liquid pump, a pump controller, a fluid reservoir, a power supply, sensors and more. The CDU's heat exchanger may be a liquid-to-liquid heat exchanger that includes a first loop with inlet and outlet connectors having a first pair of liquid connectors coupled to external liquid supply/return lines to form a primary loop. The liquid supply/return lines may be fluidly connected to a set of room manifolds, which may be coupled to an external heat removal system, or external cooling loop. In addition, the heat exchanger may further include a second loop with two connectors having a second pair of liquid connectors coupled to the fluid manifold to form a secondary loop that fluidly supplies and returns fluid between one or more server chassis and the CDU.

Each of the server chassis may house one or more servers which may include one or more components such as, for example, central processing units or CPUs, graphical processing units (GPUs), memory, and/or storage devices. Each component may perform data processing tasks, where the component may include software installed in a storage device, loaded into the memory, and executed by one or more processors to perform the data processing tasks. At least some of these components may be attached to the bottom of any of the cold plates as described above. A server may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

A server rack may further include an optional RMU configured to provide and manage power supplied to servers, fan modules, and the CDU. The RMU may be coupled to a power supply unit to manage the power consumption of the power supply unit. The power supply unit may include the necessary circuitry (e.g., an alternating current (AC) to direct current (DC) or DC to DC power converter, backup battery, transformer, or regulator, etc.) to provide power to the rest of the components of the server rack.

Aspects of the cooling distribution system can be flexible and deployable in different system architectures; for example, the system can be deployed with a localized pumping system (e.g., a closed system architecture) or central pumping system (e.g., an open system architecture). Aspects described can simultaneously separate IT equipment from leaked fluid and direct leaked fluid to pool in a common location for detection, thereby minimizing the impact of a fluid leak and increasing overall system reliability.

Some embodiments may include a non-transitory machine-readable medium (such as microelectronic memory) having stored thereon instructions, which program one or more data processing components (generically referred to here as a "processor") to perform operations described herein. In some embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A connector assembly, comprising:
   a distribution frame including an adjusting channel; and
   a distribution module disposed and slidably moveable along the adjusting channel, the distribution module including:
   an inlet connector to receive cooling liquid from a cooling liquid loop,
   a fluid blind mate connector to connect the cooling liquid loop to one or more cold plates of a server chassis, and
   a guiding element having a guiding structure and configured to house the fluid blind mate connector, wherein when the guiding element contacts the server chassis, the guiding element causes the distribution module to move relative to the adjusting channel to align the fluid blind mate connector with a server connector of the server chassis, such that the fluid blind mate connector connects with the server connector to distribute the cooling liquid to the server chassis.

2. The connector assembly of claim 1, further comprising a guiding panel to be coupled to a rear portion of the server chassis, the guiding panel having one or more openings configured to guide the guiding element during a coupling of the fluid blind mate connector and the server connector to form a fluid connection between the server chassis and the cooling liquid loop.

3. The connector assembly of claim 1, further comprising a flexible hose connecting the distribution module to a cooling liquid loop connector to form a fluid connection between the cooling liquid loop connector and the distribution module.

4. The connector assembly of claim 1, further comprising one or more connectors disposed on a plurality of predefined locations on the distribution module, wherein distribution module includes a plurality of fluid channels for delivery of cooling liquid via one of the one or more connectors to the server chassis through the fluid blind mate connector.

5. The connector assembly of claim 4, wherein the plurality of fluid channels are configured to distribute the cooling liquid from one of the one or more connectors to another one of the one or more connectors.

6. The connector assembly of claim 4, wherein the one or more connectors are disposed on a rear portion of the distribution module, the one or more connectors being configured to connect the distribution module to a first supply connector of the cooling liquid loop via a first flexible hose to form a first fluid supply and return lines between the cooling liquid loop and the server chassis.

7. The connector assembly of claim 4, wherein at least one of the one or more connectors is configured to connect the distribution module to another distribution module via a first flexible hose.

8. The connector assembly of claim 7, wherein at least one of the one or more connectors is configured to connect the distribution module to a second supply connector via a second flexible hose to form a second fluid supply and return lines between the cooling liquid loop and the server chassis.

9. The connector assembly of claim 1, further comprising a leak detection arrangement including a first leak detector disposed underneath a rear portion of the distribution module.

10. The connector assembly of claim 9, further comprising a leak detection arrangement including a second leak detector disposed underneath the server connectors of the server chassis.

11. An electronic rack, comprising:
    a plurality of server chassis; and
    a connector assembly attached to each of the plurality of server chassis, the connector assembly including:
    a distribution frame including an adjusting channel; and
    a plurality of distribution modules corresponding to the plurality of server chassis and disposed and slidably moveable along the adjusting channel, each of the plurality of distribution modules including:
    an inlet connector to receive cooling liquid from a cooling liquid loop,
    a fluid blind mate connector to connect the cooling liquid loop to one or more cold plates of a corresponding server chassis of the plurality of server chassis, and
    a guiding element having a guiding structure and configured to house the fluid blind mate connector, wherein when the guiding element contacts with the server chassis, the guiding element causes a distribution module of the plurality of distribution modules to move relative to the adjusting channel to align the fluid blind mate connector with a server connector of the corresponding server chassis, such that the fluid blind mate connector connects with the server connector to distribute the cooling liquid to the corresponding server chassis.

12. The electronic rack of claim 11, further comprising a guiding panel to be coupled to a rear portion of each of the plurality of server chassis, the guiding panel having one or more openings configured to guide the guiding element during a coupling of the fluid blind mate connector and the server connector to form a fluid connection between each of the plurality of server chassis and the cooling liquid loop.

13. The electronic rack of claim 11, further comprising a flexible hose connecting the corresponding distribution module to a cooling liquid loop connector to form a fluid connection between the cooling liquid loop connector and the corresponding distribution module.

14. The electronic rack of claim 11, further comprising one or more connectors disposed on a plurality of predefined locations on each of the plurality of distribution modules, wherein each of the plurality of distribution modules includes a plurality of fluid channels for delivery of cooling liquid via one of the one or more connectors to each of the plurality of server chassis through the fluid blind mate connector.

15. The electronic rack of claim 14, wherein the plurality of fluid channels are configured to distribute the cooling liquid from one of the one or more connectors to another one of the one or more connectors, thereby ensuring continuity of fluid distribution within a network of the plurality of distribution modules.

16. The electronic rack of claim 14, wherein the one or more connectors are disposed on a rear portion of each of the plurality of distribution modules, the one or more connectors being configured to connect the plurality of distribution modules to a first supply connector of the cooling liquid loop via a first flexible hose to form a first fluid supply and return lines between the cooling liquid loop and the plurality of server chassis.

17. The electronic rack of claim 14, wherein at least one of the one or more connectors is configured to connect a distribution module of the plurality of distribution modules to another distribution module of the plurality of distribution modules via a first flexible hose.

18. The electronic rack of claim 17, wherein at least one of the one or more connectors is configured to connect the distribution module to a second supply connector via a second flexible hose to form a second fluid supply and return lines between the cooling liquid loop and the corresponding server chassis.

19. A data center comprising:
a plurality of electronic racks, each of the plurality of the electronic racks including:
a plurality of server chassis; and
a connector assembly attached to each of the plurality of server chassis, the connector assembly including:
a distribution frame including an adjusting channel; and
a plurality of distribution modules corresponding to the plurality of server chassis and disposed and slidably moveable along the adjusting channel, each of the plurality of distribution modules including:
an inlet connector to receive cooling liquid from a cooling liquid loop,
a fluid blind mate connector to connect the cooling liquid loop to one or more cold plates in a corresponding server chassis of the plurality of server chassis, and
a guiding element having a guiding structure and configured to house the fluid blind mate connector, wherein when the guiding element contacts with the corresponding server chassis, the guiding element causes the distribution module to move relative to the adjusting channel to align the fluid blind mate connector with a server connector of the corresponding server chassis, such that the fluid blind mate connector connects with the server connector.

20. The data center of claim 19, wherein each electronic rack further comprises a guiding panel to be coupled to a rear portion of each of the plurality of server chassis, the guiding panel having one or more openings configured to guide the guiding element during a coupling of the fluid blind mate connector and the server connector to form a fluid connection between each of the plurality of server chassis and the cooling liquid loop.

* * * * *